(12) United States Patent
Bartling et al.

(10) Patent No.: US 7,764,213 B2
(45) Date of Patent: Jul. 27, 2010

(54) CURRENT-TIME DIGITAL-TO-ANALOG CONVERTER

(75) Inventors: James E. Bartling, Chandler, AZ (US); David L. Otten, Chandler, AZ (US); D. C. Sessions, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 12/165,950

(22) Filed: Jul. 1, 2008

(65) Prior Publication Data

US 2010/0001889 A1 Jan. 7, 2010

(51) Int. Cl.
*H03M 1/82* (2006.01)
(52) U.S. Cl. ...................................................... 341/152
(58) Field of Classification Search ................... 341/152
See application file for complete search history.

(56) References Cited

U.S. PATENT DOCUMENTS

| | | | | |
|---|---|---|---|---|
| 4,571,572 | A * | 2/1986 | Noda et al. | 341/126 |
| 5,373,292 | A * | 12/1994 | Yasuda | 341/108 |
| 5,841,383 | A | 11/1998 | Regier | 341/122 |
| 6,362,766 | B1 * | 3/2002 | Rowan et al. | 341/152 |
| 7,224,303 | B2 | 5/2007 | Kwon | 341/144 |
| 7,477,176 | B2 * | 1/2009 | Faust et al. | 341/144 |
| 2007/0096773 | A1 | 5/2007 | Takashima et al. | 327/94 |
| 2008/0074202 | A1 | 3/2008 | Gabara | 331/50 |
| 2008/0074302 | A1 | 3/2008 | Akizuki et al. | 341/141 |

FOREIGN PATENT DOCUMENTS

| | | |
|---|---|---|
| GB | 2090706 A | 7/1982 |
| JP | 56013598 | 2/1981 |
| JP | 01286625 A * | 11/1989 |
| JP | 02151126 | 6/1990 |
| JP | 05175850 | 7/1993 |
| JP | 05175851 | 7/1993 |

OTHER PUBLICATIONS

International PCT Search Report and Written Opinion, PCT/US2009/048745, 16 pages, mailed Nov. 18, 2009.

* cited by examiner

*Primary Examiner*—Howard Williams
(74) *Attorney, Agent, or Firm*—King & Spalding L.L.P.

(57) ABSTRACT

A high resolution digital-to-analog converter comprises a programmable n-bit current digital-to-analog converter (IDAC), an m-bit programmable counter/timer, an integrator that converts the IDAC constant current charging a capacitor over time into an a precision (high resolution) analog voltage, and a sample and hold circuit for storing the precision analog voltage. The constant current from the IDAC is applied to the integrator for a time period determined by the programmable counter/timer, then the sample and hold circuit will sample the final voltage on the capacitor and store it as an analog voltage. The analog voltage resolution of this high resolution digital-to-analog converter is n+m bits or binary $2^{n+m}$. In addition, a plurality of sample and hold circuits may be utilized for maintaining a plurality of analog output voltages.

6 Claims, 8 Drawing Sheets

US 7,764,213 B2

CURRENT-TIME DIGITAL-TO-ANALOG CONVERTER

TECHNICAL FIELD

The present disclosure relates to digital-to-analog converters, and more particularly, to generating very precise and high resolution analog voltages with a digital-to-analog converter having a programmable constant current source that charges a capacitor of a known capacitance value over a specified time period determined by a programmable counter/timer then sampling and holding the analog voltage on the capacitor after the specified time period ends.

BACKGROUND

Digital-to-analog converters (DACs) are used wherever analog signals are required for control, display and interfacing with humans. Numerous applications using digital processing require analog outputs, such as in digital signal processing (DSP), liquid crystal display (LCD) image generation, analog set point control, analog offset correction of sensors and the like, etc. Typically, DACs have been implemented using precision resistor ladder networks configured as a voltage divider having a plurality of analog voltage taps each tap having a different voltage value that is digitally selected as an analog output by the digital control portion of the DAC. However, as resolution (finer granularity) requirements of the analog output of the DAC increase, costs and die size increase exponentially. In order to obtain a 10 to 12 bit ($2^{10}$ to $2^{12}$) voltage resolution, a resistor ladder DAC would be extremely complex, expensive and require a great deal of integrated circuit die real estate. For binary 16 bit resolution, the complexity and cost of a resistor ladder DAC would be prohibitive.

SUMMARY

Therefore there is a need for a high resolution DAC that is not cost prohibitive, complex nor requires a large amount of integrated circuit die area to implement. Furthermore, providing for multiple DAC analog outputs that may be maintained at desired voltages and are independent of each other is also very desirable.

This need may be satisfied, according to the teachings of this disclosure, with a high resolution digital-to-analog converter that comprises a programmable n-bit current digital-to-analog converter (IDAC), an m-bit programmable counter/timer, an integrator that converts the constant current over time into a precision (high resolution) analog voltage, and a sample and hold circuit for storing the precision analog voltage. The constant current from the IDAC is applied to the integrator for a time period determined by the programmable counter/timer, then the sample and hold circuit will sample the final voltage on the capacitor and store it as an analog voltage. The analog voltage resolution of this high resolution digital-to-analog converter is n +m bits or binary $2^{n+m}$. In addition, a plurality of sample and hold circuits may be utilized for maintaining a plurality of analog output voltages. A precision frequency clock may further enhance the resulting precision of the analog voltage from the DAC.

According to a specific example embodiment of this disclosure, a current-time digital-to-analog converter (CT DAC) comprises: a current digital-to-analog converter (IDAC) having digital inputs and a current output having a constant current value selectable from a plurality of constant current values determined by digital logic levels on the digital inputs; a counter/timer having a clock input, digital inputs and a charge control output; a current-to-voltage integrator, the current-to-voltage integrator having a current input coupled to the current output of the IDAC and a control input coupled to the charge control output of the counter/timer, wherein the integrator converts the constant current, having the selected constant current values, from the IDAC to analog voltages over time periods determined by the counter/timer; and a sample and hold circuit, wherein the sample and hold circuit samples and holds each one of the analog voltages from an output of the current-to-voltage integrator at respective sequential times.

According to another specific example embodiment of this disclosure, a method for generating a high resolution analog voltage comprises the steps of: generating a constant current having at least one current value; charging an integration capacitor to a voltage with the constant current over at least one time period; sampling the voltage on the integration capacitor at the end of the at least one time period; storing the sampled voltage; and providing the stored sampled voltage as a high resolution analog voltage.

According to yet another specific example embodiment of this disclosure, a method for generating a high resolution analog voltage having a plurality of different voltage values, comprises the steps of: a) generating a constant current having at least one current value; b) charging an integration capacitor to a voltage with the constant current over at least one time period; c) sampling the voltage on the integration capacitor at the end of the at least one time period; d) storing the sampled voltage; e) providing the stored sampled voltage as a high resolution analog voltage; f) removing the voltage on the integration capacitor; and g) returning to steps a) to f) using a next at least one current value and a next at least one time period for the step of charging the integration capacitor.

According to still another specific example embodiment of this disclosure, a method for generating a plurality of high resolution analog voltages comprises the steps of: a) generating a constant current having at least one current value; b) charging an integration capacitor to a voltage with the constant current over at least one time period; c) sampling and storing the voltage on the integration capacitor at the end of the at least one time period in a respective one of a plurality of sample and hold circuits; d) removing the voltage on the integration capacitor; e) providing the sampled and stored voltage from the respective one of the plurality of sample and hold circuits as a respective one of a plurality of high resolution analog voltages; and f) returning to steps a) to e) using a next at least one current value and a next at least one time period for the step of charging the integration capacitor.

According to another specific example embodiment of this disclosure, a method for generating a plurality of high resolution analog voltages comprises the steps of: a) presorting voltage values of a plurality of high resolution analog voltages in ascending voltage value order; b) determining voltage differences between each of the ascending order voltage values; c) determining voltage configuration information for generating a first voltage value of the plurality of high resolution analog voltages and voltage increases required for generating subsequent voltage values of the plurality of high resolution analog voltages; d) generating a constant current having at least one current value determined from the voltage configuration information; e) charging an integration capacitor to a voltage with the constant current over at least one time period determined from the voltage configuration information; f) sampling and storing the voltage on the integration capacitor at the end of the at least one time period in a respective one of a plurality of sample and hold circuits; g)

providing the sampled and stored voltage from the respective one of the plurality of sample and hold circuits as a respective one of the plurality of high resolution analog voltages; and h) returning to steps d) to g) using a next at least one current value and a next at least one time period for the step of charging the integration capacitor.

BRIEF DESCRIPTION OF THE DRAWINGS

A more complete understanding of the present disclosure thereof may be acquired by referring to the following description taken in conjunction with the accompanying drawings wherein.

Figure 1:
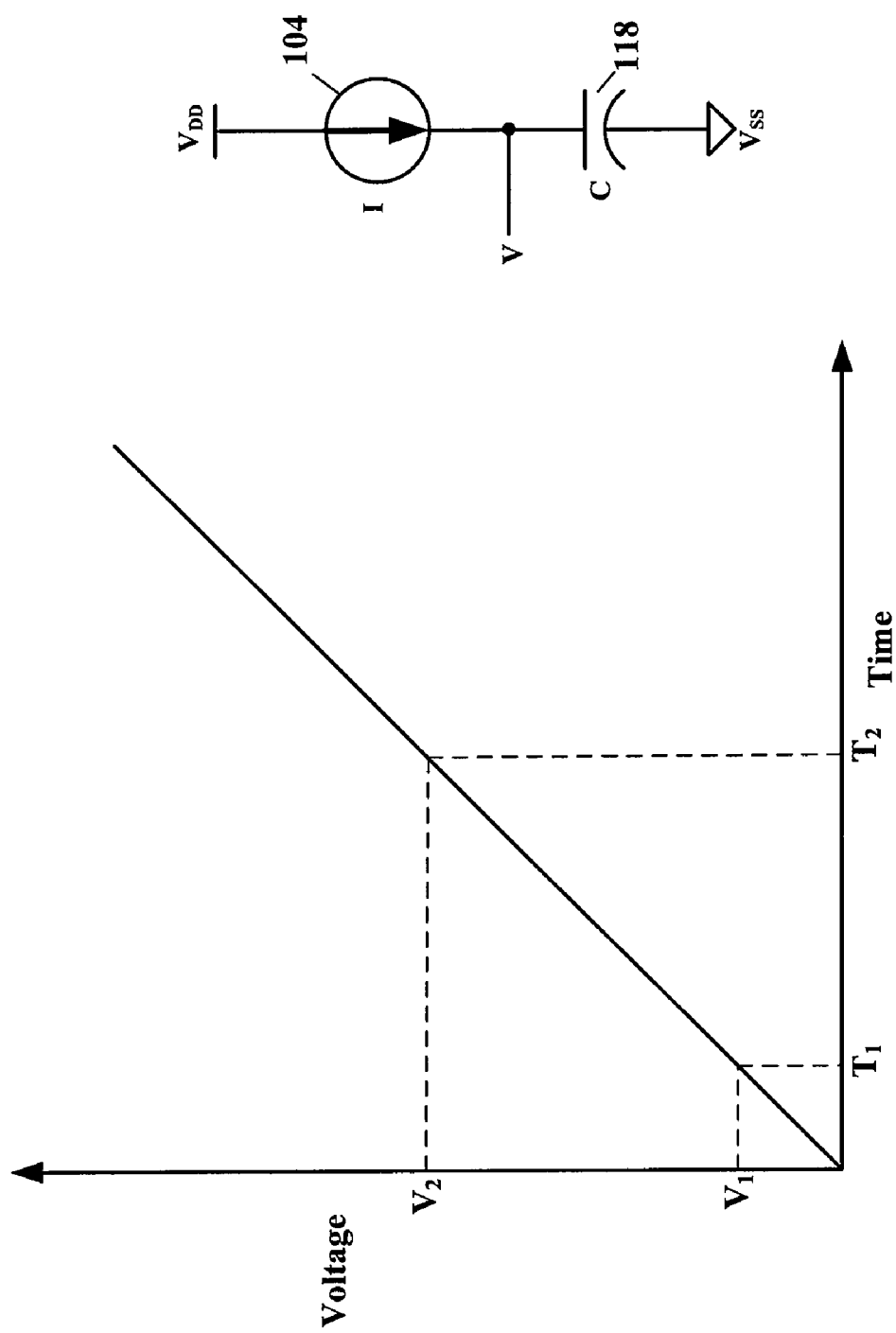
FIG. 1 is a time-voltage graph of a capacitor being charged from a constant current source.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a time-voltage graph of a capacitor being charged from a constant current source. When a capacitor 118 is charged through a constant current source 104, the voltage, V, across the capacitor 118 increases linearly (monotonically) with time, according to equation (1):

$$I = C*dV/dT \qquad \text{Eq. (1)}$$

where C is the capacitance value of the capacitor 118, I is the current from the constant current source 104 and V is the voltage on the capacitor 118 at time T. When any three values of the current I; time T, capacitance C, and voltage V are known; the other unknown value may be calculated from the three known values. For example, if the capacitance of the capacitor 118, the charging current from the constant current source 104, and the time over which the capacitor 118 is charged by the constant current source 104 are known, then the voltage V may be determined. Thus by knowing the current value, I, from the constant current source 104, the capacitance value, C, of the capacitor 118, and the time, T, that the charging current from the current source 104 is applied to the capacitor 118, the capacitor 118 may be charged to a very precise voltage, V. By integrating equation (1) and solving for V, an exact voltage value may be determined according to equation (2):

$$V = I/C*T \qquad \text{Eq. (2)}$$

Figure 2:
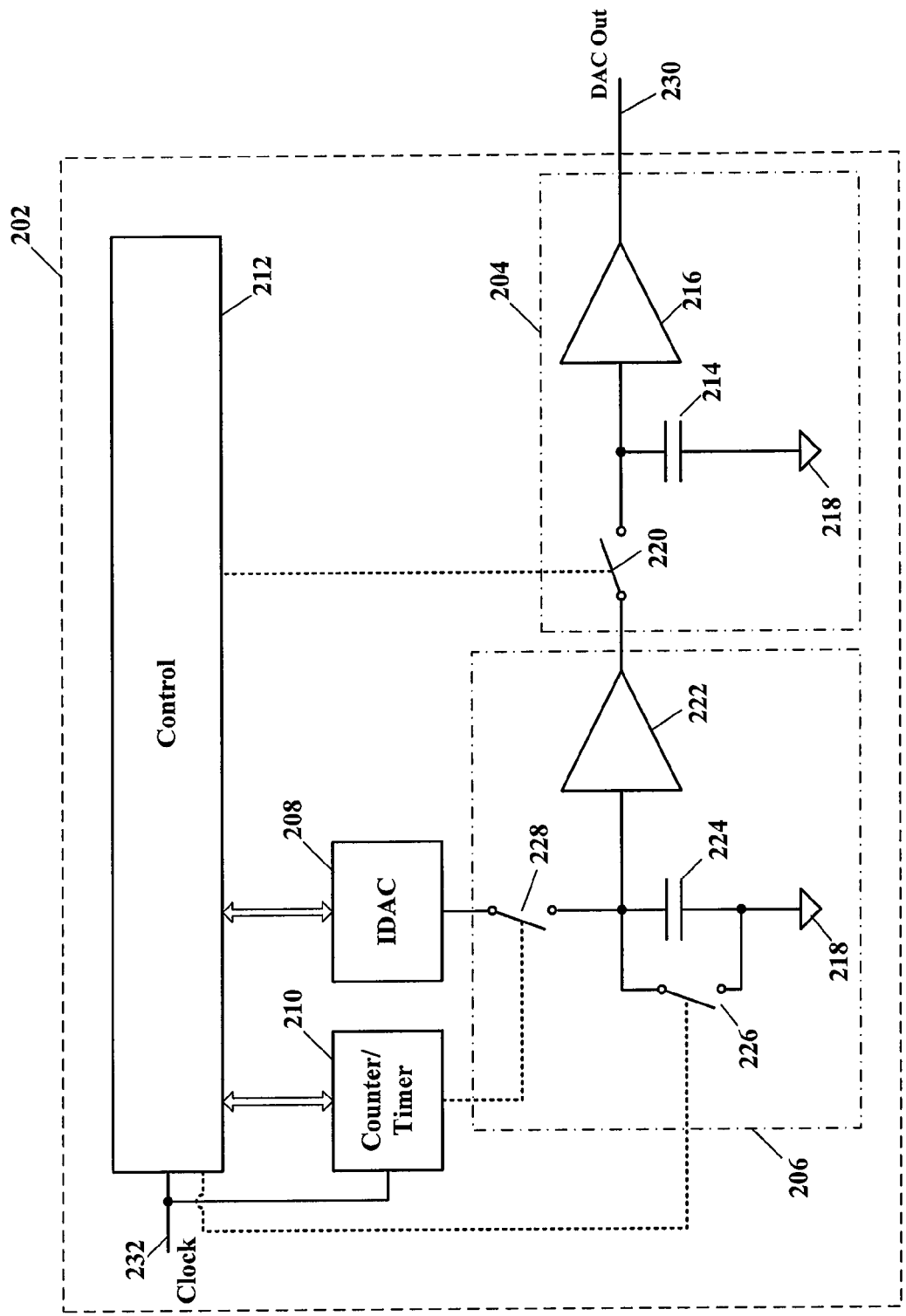
FIG. 2 is a schematic diagram of a current-time digital-to-analog converter, according to a specific example embodiment of this disclosure.

Referring to FIG. 2, depicted is a schematic diagram of a current-time digital-to-analog converter, according to a specific example embodiment of this disclosure. A current-time digital-to-analog converter ("CT DAC") 202 may comprise a sample and hold circuit 204, current-time to voltage integrator 206, a current digital-to-analog converter (IDAC) 208, a counter/timer 210, and control logic 212. The CT DAC 202 may be fabricated on an integrated circuit die, individually or in combination with other analog and/or digital circuits (e.g., mixed signal device), and may be packaged in an integrated circuit package (not shown). The clock frequency depends on the resolution required of the analog output signal 230 and the conversion time desired, e.g., the finer the granularity count (greater number) of the counter/timer 210 will enable a more precise time period. The clock frequency may be determined by one having ordinary skill in the art of mixed signal circuit design and having the benefit of this disclosure. For example, but not limited to, a 16 MHz clock may be utilized for 10-bit accuracy and a 64 MHz clock may be utilized for 12 bit accuracy, either having a conversion time of about 4.125 microseconds for a single channel and 0.1875 microseconds for each additional channel. The clock 232 frequency may be determined by an accurate and stable oscillator (not shown), e.g., crystal oscillator, and the like. Also an internal oscillator circuit may be designed to cancel out component, current and/or voltage value changes over temperature and voltage variations so as to minimize frequency drift.

The sample and hold circuit 204 may comprise a sample and hold capacitor 214, a sample switch 220 and a buffer (isolation) amplifier 216. The sample and hold capacitor 214 stores a voltage charge when the sample switch 220 closes, then when sample switch 220 opens, the voltage charge stored on the capacitor 214 remains and is buffered by the buffer amplifier 216 whose output may be used as a voltage output 230 of the CT DAC 202. The capacitor 214 is charged as referenced to a common or ground 218.

The current-time to voltage integrator 206 may comprise an integration capacitor 224, a charging switch 228, a discharge switch 226 and a buffer amplifier 222. When the discharge switch 226 closes substantially all voltage charge on the integration capacitor 224 is removed therefrom. The IDAC 208 is coupled to the integration capacitor 224 through the charging switch 228. When the charging switch 228 is closed, the integration capacitor 224 charges to a voltage, V, dependant upon how long a time, T, that the charging switch 228 is closed, according to equation (2) hereinabove. The bit resolution granularity of the resultant voltage, V, depends upon the combined bit resolutions of the IDAC 208 and the counter/timer 210. For example, for a four-bit binary IDAC 208 and an eight-bit binary counter/timer 210, the integrated voltage resolution will be two (2) raised to the exponent (4+8), or $2^{12}$ voltage solution. A finer granularity IDAC 208 and/or counter/timer 210 will result in an even finer resolution integration voltage, V. The buffer amplifier 222 allows fast charging of the sample and hold capacitor 214 when the sample switch 220 is closed. The buffer amplifier 222 preferably has a very high input impedance so as not to substantially affect the voltage charging accuracy of the integration capacitor 224.

The control logic 212 determines when the switches 220, 226 and 228 are open and closed, at what constant current value, I, that the IDAC 208 should be programmed for while charging the integration capacitor 224 over time, T. The counter/timer 210 determines the time, T, by counting the number of clocks 232 received thereto. The control logic 212 programs the counter/timer 210 with an appropriate clock count number that will result in a time, T, needed for charging the integration capacitor 224 to a desired voltage, V. Once the number, programmed into the counter/timer 210, of clocks received has been reached, the counter/timer 210 causes the switch 228 to open, thus stopping further voltage charge on the integration capacitor 224. Then a sample of the voltage, V, is taken from the output of the buffer amplifier 222 by switch 220 of the sample and hold circuit 204. Once the sample of the voltage, V, is taken, it will be maintained at an output (230) of the sample and hold circuit 204.

Figure 3:
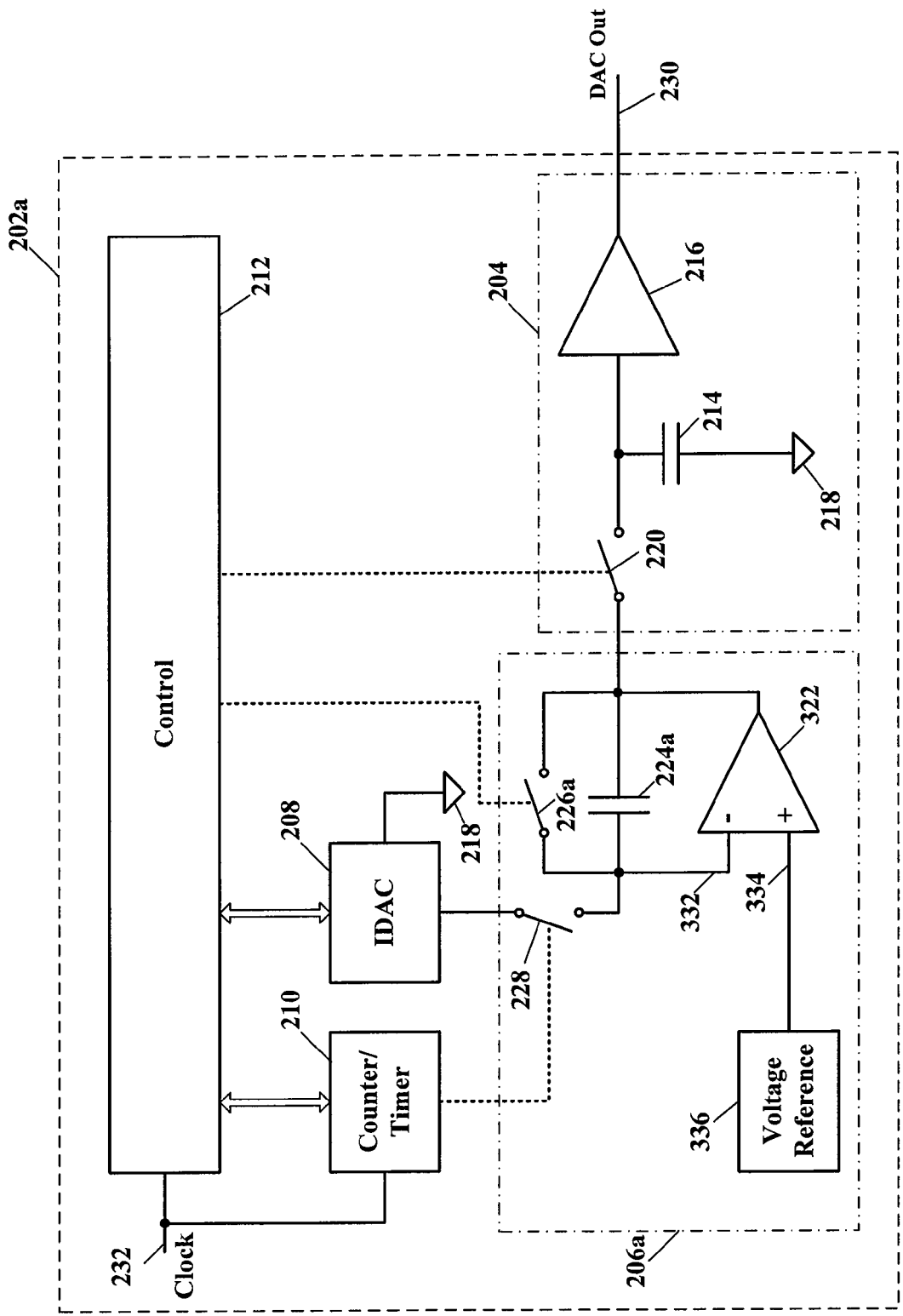
FIG. 3 is a schematic diagram of a current-time digital-to-analog converter, according to another specific example embodiment of this disclosure.

Referring to FIG. 3, depicted is a schematic diagram of a current-time digital-to-analog converter, according to another specific example embodiment of this disclosure. A current-time digital-to-analog converter ("CT DAC") 202*a* may comprise a sample and hold circuit 204, current-time to voltage integrator 206*a*, a current digital-to-analog converter (IDAC) 208, a counter/timer 210, and control logic 212. The sample and hold circuit 204, IDAC 208, counter/timer 210 and control logic 212 operate the same as described hereinabove for those circuits shown in FIG. 2.

The current-time to voltage integrator 206*a* differs from the current-time to voltage integrator 206 shown in FIG. 2 in circuit design, not in resulting operation. The integration of the constant current from the IDAC 208 over the programmed time, T, to produce a voltage charge on the capacitor 224*a* follows equation (2) hereinabove. However, the circuit configuration of the voltage integrator 206*a* presents a more constant load voltage to the IDAC 208 when the integration capacitor 224*a* is being charged. This improves the linearity of the current from the IDAC 208 and the subsequent accuracy of the resulting voltage charge on the integration capacitor 224*a*. An operational amplifier 322 is also coupled to a voltage reference 336, for example but not limited to, a bandgap voltage reference. The operational amplifier 322 provides a constant load and isolation to the IDAC 208, and a low impedance output to the sample switch 220.

Switches 220, 226 and 228 shown in FIGS. 2 and 3 may be any type of switching device such as, for example but not limited to, metal oxide semiconductor field effect transistors (MOSFETs) as typically used in integrated circuit design. One having ordinary skill in integrated circuit design and the benefit of the teachings of this disclosure would understand the most advantageous implementation for these switches and the associated control logic 212.

Figure 4:
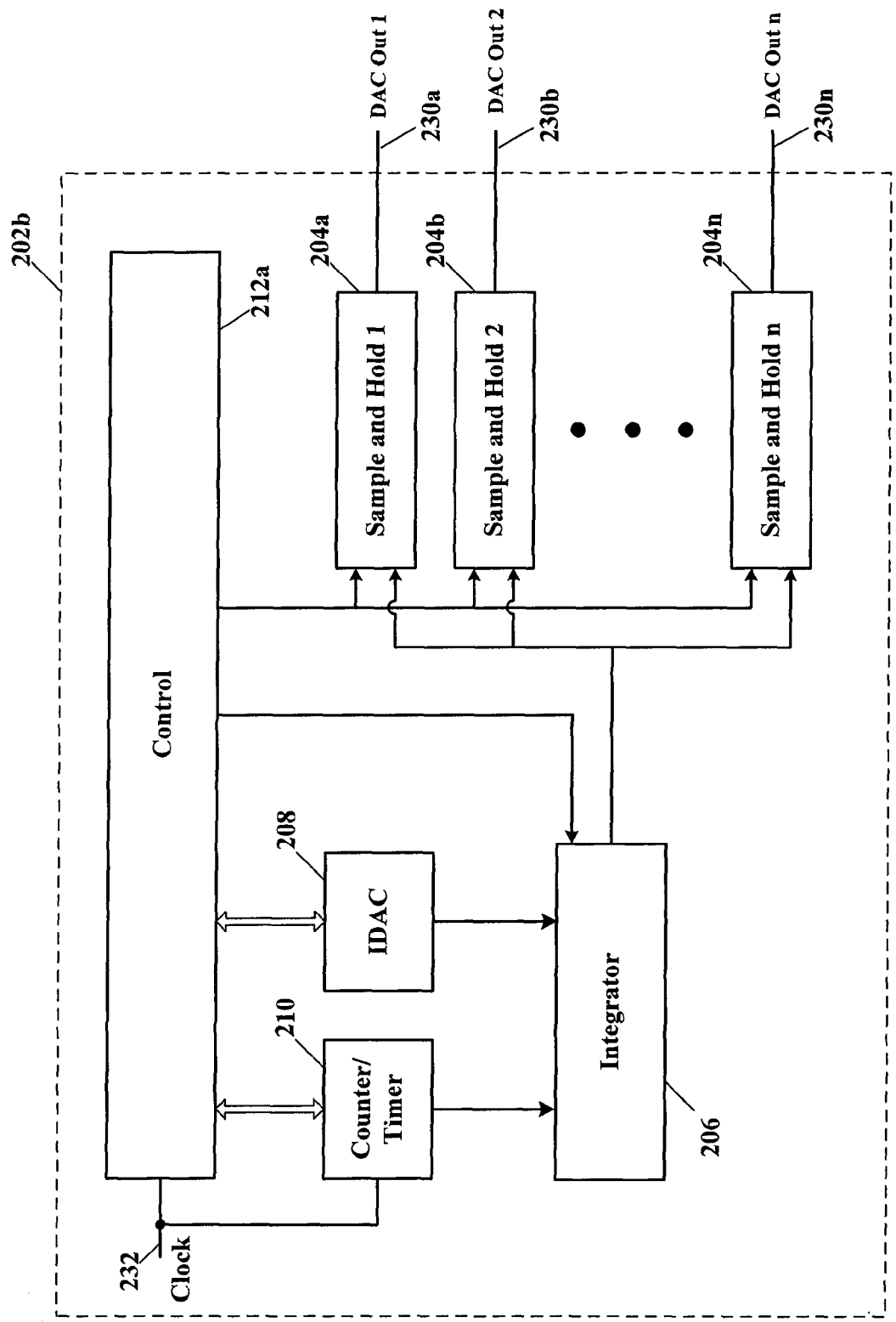
FIG. 4 is a schematic block diagram of a current-time digital-to-analog converter having a plurality of analog outputs, according to still another specific example embodiment of this disclosure.

Referring to FIG. 4, depicted is a schematic block diagram of a current-time digital-to-analog converter having a plurality of analog outputs, according to still another specific example embodiment of this disclosure. A current-time digital-to-analog converter ("CT DAC") 202*b* may comprise a plurality of sample and hold circuits 204, current-time to voltage integrator 206, a current digital-to-analog converter (IDAC) 208, a counter/timer 210, and control logic 212*a*. The plurality of sample and hold circuits 204, IDAC 208, counter/timer 210 and control logic 212 operate the same as described hereinabove for those circuits shown in FIGS. 2 and 3. Since a sample and hold circuit 204 samples a voltage then retains that voltage over a desired period of time, the integrator 206, IDAC 208, counter/timer 210 and control logic 212*a* may be utilized for generating a plurality of very accurate analog voltages at the respective outputs 230 of the plurality of sample and hold circuits 204. The control logic 212*a* controls which one of the plurality of sample and hold circuits 204 is coupled to the output of the integrator 206 at any given time. Therefore the integrator 206 generates different voltage values at different times, and at the appropriate times the plurality of sample and hold circuits 204 will sample and retain those different voltage values as appropriately determined by the control logic 212*a*. One having ordinary skill in mixed signal (digital and analog) design would readily understand how to implement these circuits when having the benefit of this disclosure.

Figure 5:
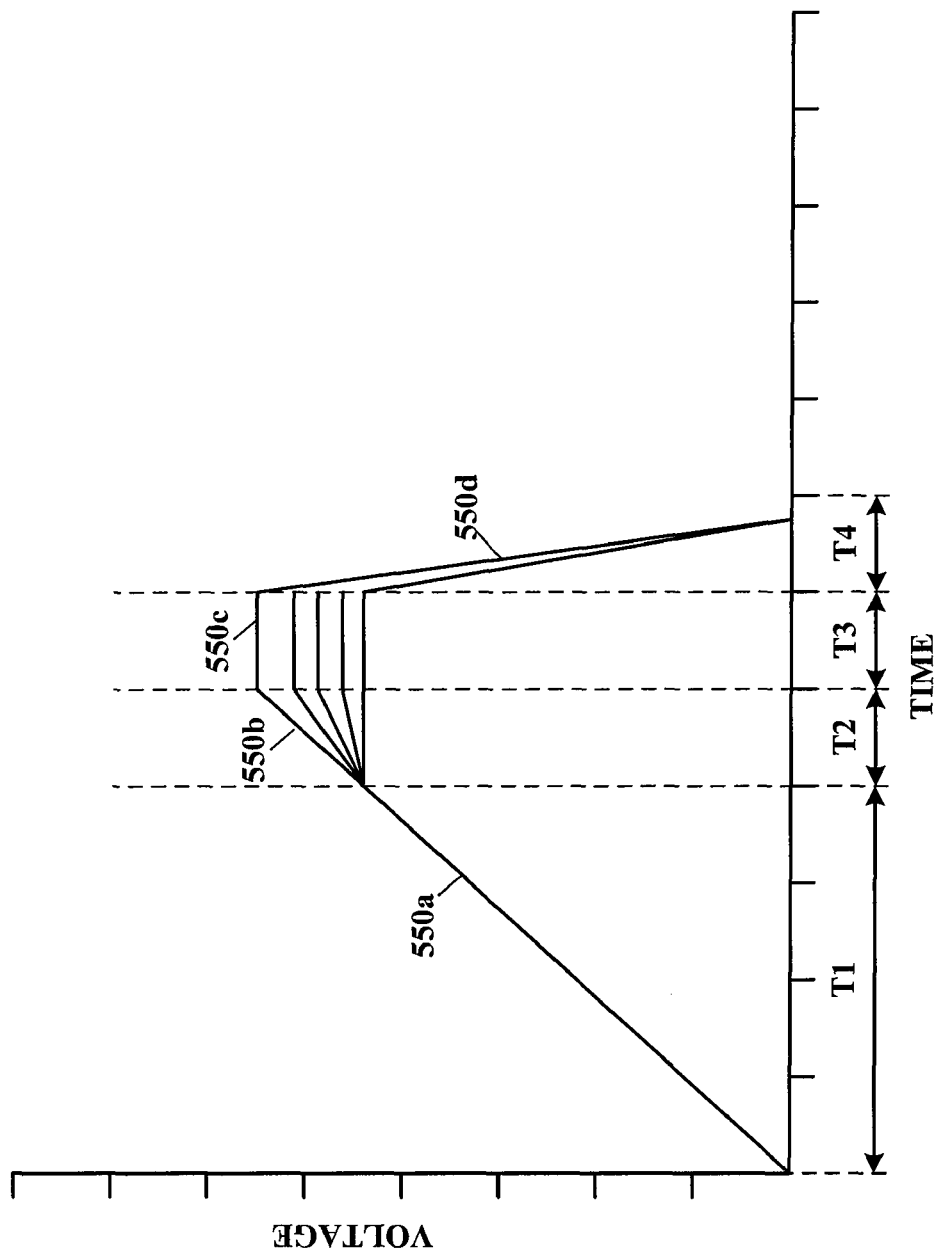
FIG. 5 is a schematic graphical representation of voltage-time curves of the current-time digital-to-analog converters according to the teachings of this disclosure.

Referring to FIG. 5, depicted is a schematic graphical representation of voltage-time curves of the current-time digital-to-analog converters according to the teachings of this disclosure. When the IDAC 208 is coupled to the integration capacitor 224, monotonic voltage charges 550*a* and 550*b* on the capacitor 224 will begin and continue over time periods T1 and T2, respectively. Typically, when the voltage charge 550*a* requires the full output of the IDAC 208 over the time T1, all control bits to the IDAC 208 will be high, e.g., IDAC 208 at its maximum constant current output. This maximum constant current output will be applied to capacitor 224 for a certain number of clocks represented by the time T1. However, when the voltage charge 550 on the capacitor 224 is nearing the final desired value, then the maximum constant current output may be too large during a single clock, represented by the time T2. During time T2, the constant current output from the IDAC 208 may not be at its maximum and may be programmed by the control logic 212 to be appropriately less so as to result in producing the final desired voltage charge 550*b* at the end of time T2.

Once the desired voltage charge 550*b* at the end of time T2 is reached, then the charging switch 228 is opened and the sample switch 220 closes. During time T3 the sample and hold capacitor 214 is charged to the desired voltage charge 550*c* from the current-time to voltage integrator 206. The switch 220 is then opened and the desired voltage charge 550*c* remains on the sample and hold capacitor 214 until a different voltage is applied thereto. At the end of time T4 the switch 220 is opened and the switch 226 closes, effectively removing voltage charge 550*d* from the integration capacitor 224 so that the aforementioned cycle may begin again for the next voltage value desired.

Figure 6:
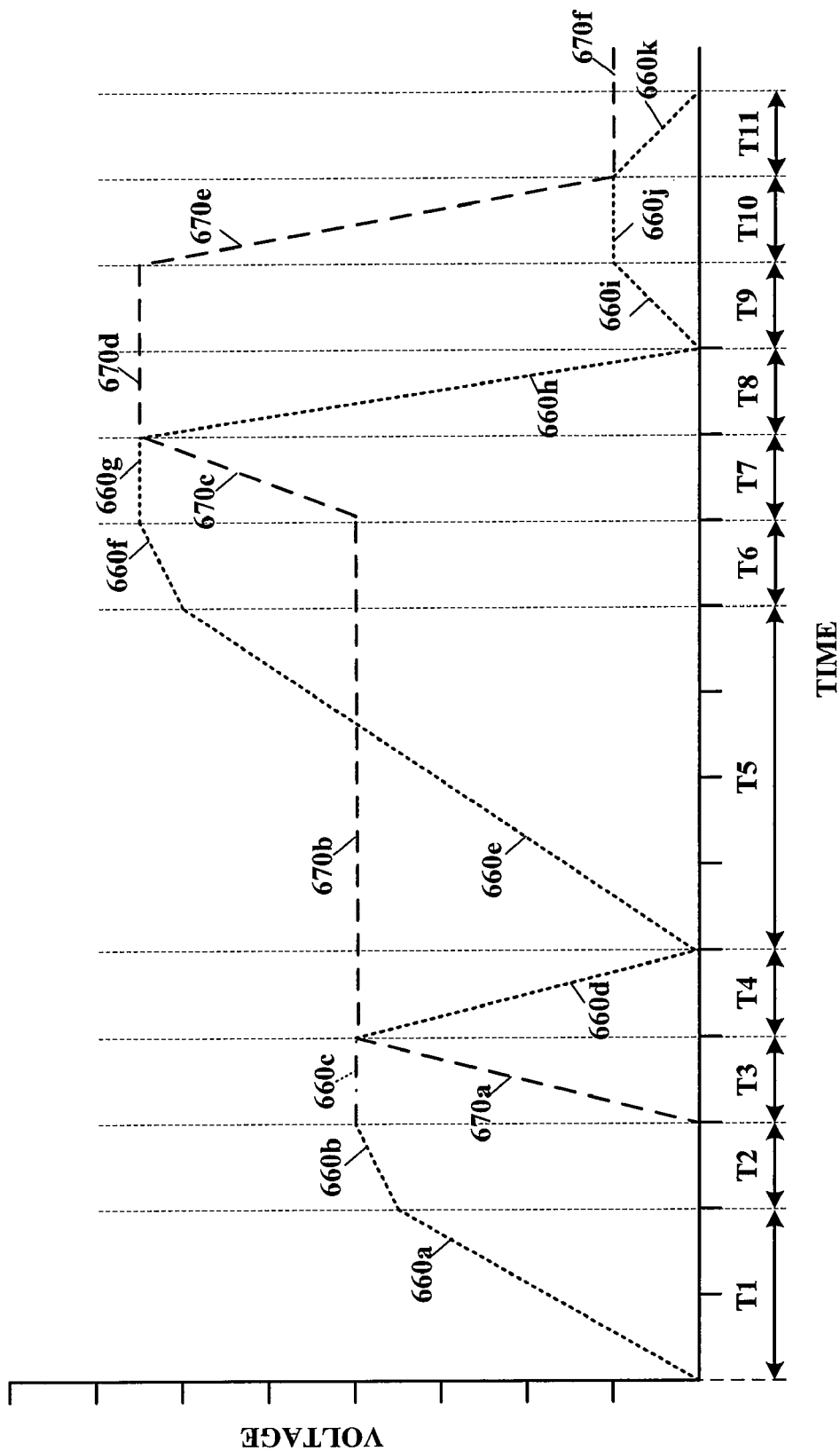
FIG. 6 is a schematic graphical representation of voltage-time curves of the current-time digital-to-analog converters of FIGS. 2 and 3, according to the teachings of this disclosure.

Referring to FIG. 6, depicted is a schematic graphical representation of voltage-time curves of the current-time digital-to-analog converters of FIGS. 2 and 3, according to the teachings of this disclosure. FIG. 6 illustrates generation of different voltage values 670 at different sequential times. A first voltage charge 660*a*-660*b* is generated on the integration capacitor 224 as described hereinabove over times T1 and T2. Once the first desired voltage value 660*c* is reached, the voltage value 660*c* is sampled by and transferred to the sample and hold circuit 204 during time T3. The sample and hold circuit 204 then retains the desired voltage value, e.g., voltage value 670*b* is substantially the same as the voltage value 660*c*. During time T4 the voltage value 660*d* is discharged from the integration capacitor 224 by the discharge switch 226.

Then during times T5 and T6 a second voltage charge is generated on the integration capacitor 224. Similarly to charging of the voltage value 660a during time T1, the voltage value 660e may be generated from a maximum constant current output from the IDAC 208 during time T5. And the voltage value 660f may be generated over time T6 as described hereinabove for generation of the voltage value 660b during time T2. Once the first desired voltage value 660g is reached, the voltage value 660g is sampled by and transferred to the sample and hold circuit 204 during time T7. The sample and hold circuit 204 then retains the desired voltage value, e.g., voltage value 670d is substantially the same as the voltage value 660g. Also during time T8 the voltage value 660h is discharged from the integration capacitor 224 by the discharge switch 226.

During time T9 a third voltage charge is generated on the integration capacitor 224. However in this example, the desired third voltage charge 660j requires a smaller value of constant current from the IDAC 208 during the charging time T9. Thus the IDAC 208 is programmed to supply less than maximum constant current when charging the integration capacitor 224 during time T9. When the desired third voltage charge 660j is reached at the end of time T9, the voltage value 660j is sampled by and transferred to the sample and hold circuit 204 during time T10. The sample and hold circuit 204 then retains the desired voltage value, e.g., voltage value 670f is substantially the same as the voltage value 660j. Also during time T11 the voltage value 660k is discharged from the integration capacitor 224 by the discharge switch 226.

Figure 7:
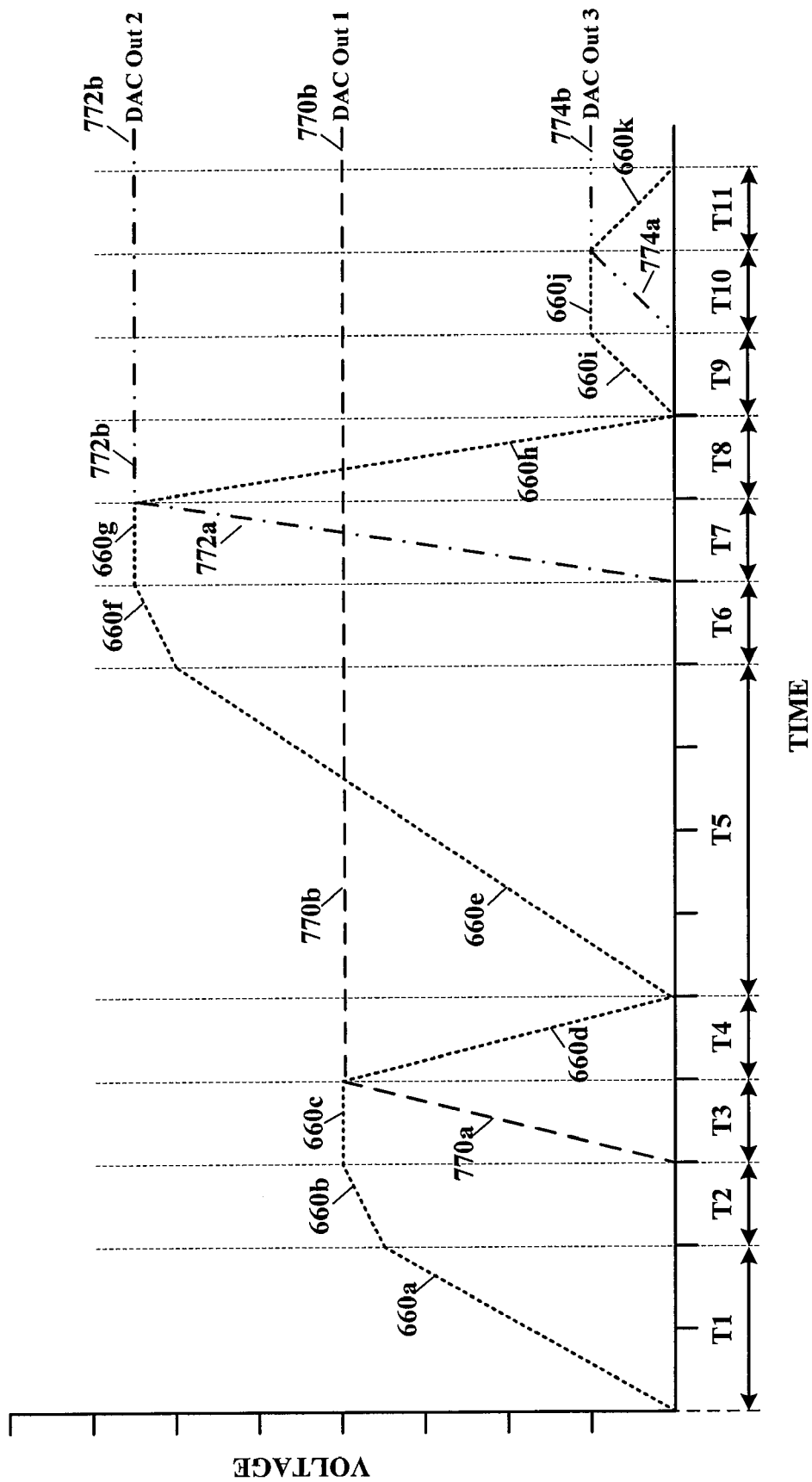
FIG. 7 is a schematic graphical representation of voltage-time curves of the current-time digital-to-analog converter of FIG. 4, according to the teachings of this disclosure.

Referring to FIG. 7, depicted is a schematic graphical representation of voltage-time curves of the current-time digital-to-analog converter of FIG. 4, according to the teachings of this disclosure. When using the circuit having a plurality of sample and hold circuits 204 shown in FIG. 4, multiple output voltages 230 (FIG. 4) may be time sequentially generated as follows.

A first voltage charge 660a-660b is generated on the integration capacitor 224 as described hereinabove over times T1 and T2. Once the first desired voltage value 660c is reached, this voltage value 660c is sampled by and transferred to a first one of the plurality of sample and hold circuits 204 during time T3. The first one of the plurality of sample and hold circuits 204 then retains the desired voltage value, e.g., voltage value 770b is substantially the same as the voltage value 660c. During time T4 the voltage value 660d is discharged from the integration capacitor 224 by the discharge switch 226.

Then during times T5 and T6 a second voltage charge is generated on the integration capacitor 224. Similarly to charging of the voltage value 660a during time T1, the voltage value 660e may be generated from a maximum constant current output from the IDAC 208 during time T5. And the voltage value 660f may be generated over time T6 as described hereinabove for generation of the voltage value 660b during time T2. Once the second desired voltage value 660g is reached, this voltage value 660g is sampled by and transferred to a second one of the plurality of sample and hold circuits 204 during time T7. The second one of the plurality of sample and hold circuits 204 then retains the desired voltage value, e.g., voltage value 772b is substantially the same as the voltage value 660g. During time T8 the voltage value 660h is discharged from the integration capacitor 224 by the discharge switch 226.

Next during time T9 a third voltage charge is generated on the integration capacitor 224. However in this example, the desired third voltage charge 660j requires a smaller value of constant current from the IDAC 208 during the charging time T9. Thus the IDAC 208 is programmed to supply less than maximum constant current when charging the integration capacitor 224 during time T9. When the desired third voltage charge 660j is reached at the end of time T9, the voltage value 660j is sampled by and transferred to a third one of the plurality of sample and hold circuits 204 during time T10. The third one of the plurality of sample and hold circuits 204 then retains the desired voltage value, e.g., voltage value 774b is substantially the same as the voltage value 660j. During time T11 the voltage value 660k is discharged from the integration capacitor 224 by the discharge switch 226. Thus three different voltage values 770, 772 and 774 are sequentially time generated and are available at the respective outputs of the plurality of sample and hold circuits 204.

Figure 8:
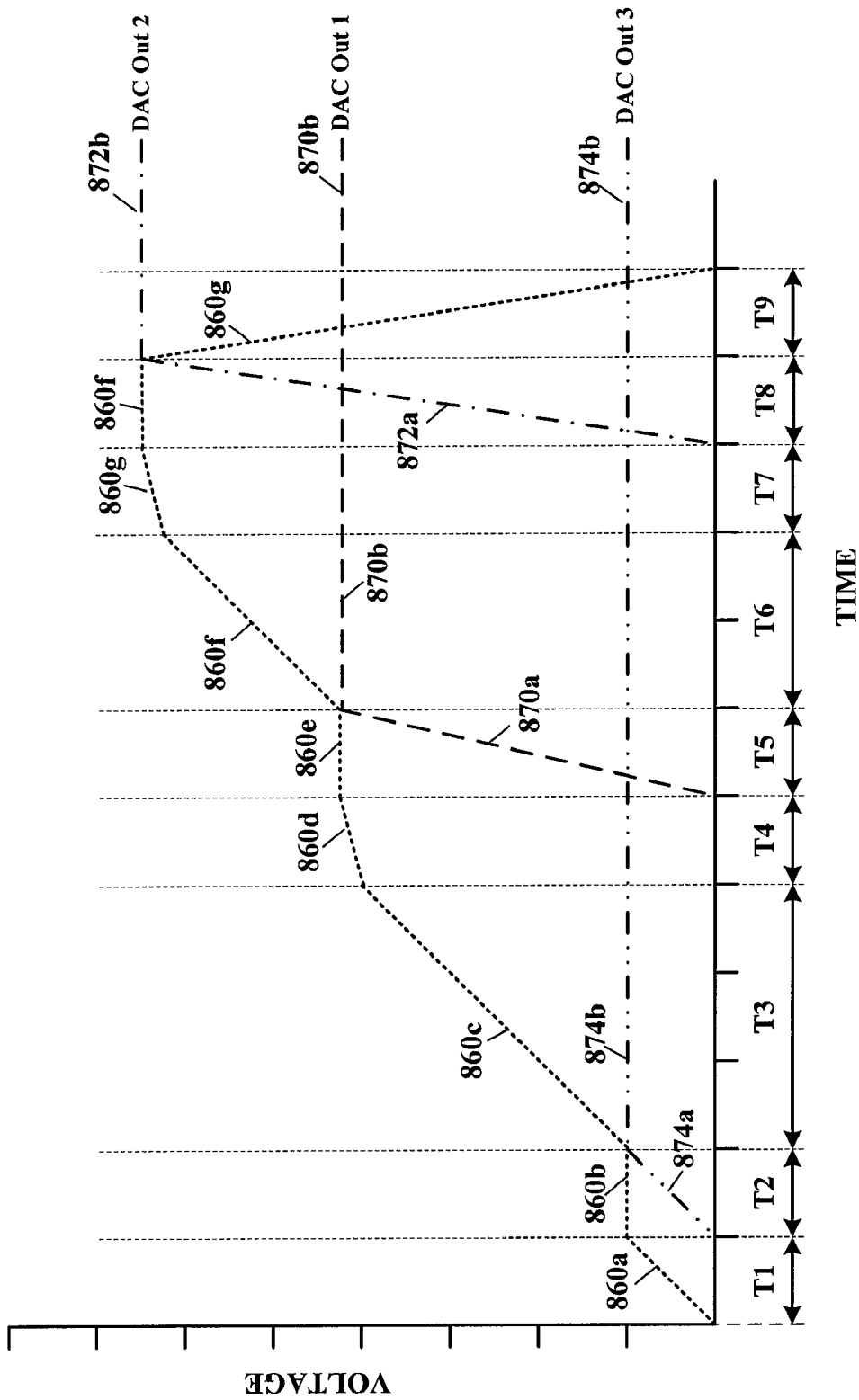
FIG. 8 is a schematic graphical representation of voltage-time curves of the current-time digital-to-analog converter of FIG. 4 wherein the analog voltages are generated in the order of ascending voltage values within a minimum time, according to the teachings of this disclosure.

Referring to FIG. 8, depicted is a schematic graphical representation of voltage-time curves of the current-time digital-to-analog converter of FIG. 4 wherein the analog voltages are generated in the order of ascending voltage values within a minimum time, according to the teachings of this disclosure. When using the circuit having a plurality of sample and hold circuits 204 shown in FIG. 4, a more time efficient way of generating multiple output voltages 230 (FIG. 4) may be time sequentially generated as follows.

A first voltage charge 860a is generated on the integration capacitor 224 as described hereinabove over time T1. Once the first desired voltage value 860b is reached, this voltage value 860b is sampled by and transferred to a third one of the plurality of sample and hold circuits 204 during time T2. The third one of the plurality of sample and hold circuits 204 then retains the desired voltage value, e.g., voltage value 874b is substantially the same as the voltage value 860b. Note the voltage value 860a does not require the maximum constant current output from the IDAC 208 during time T1.

Then during times T3 and T4 a second voltage charge is generated on the integration capacitor 224. The voltage value 860c may be generated from a maximum constant current output from the IDAC 208 during time T3. And the voltage value 860d may be generated at a reduced charging current over time T4 as described more fully hereinabove. Note that the IDAC 208 charges the integration capacitor 224 from the voltage value 860b to the higher voltage value 860e. Thus less time is required to go from the voltage value 860b to the higher voltage value 860e. This is both a savings in time and power using the teachings of the disclosure and as shown in FIG. 8.

Once the second desired voltage value 860e is reached, this voltage value 860e is sampled by and transferred to a first one of the plurality of sample and hold circuits 204 during time T5. The first one of the plurality of sample and hold circuits 204 then retains the desired voltage value, e.g., voltage value 870b is substantially the same as the voltage value 860e.

Next during times T6 and T7 a third voltage charge is generated on the integration capacitor 224. The voltage value 860f may be generated from a maximum constant current output from the IDAC 208 during time T6. And the voltage value 860g may be generated at a reduced charging current over time T7 as described more fully hereinabove. Note that the IDAC 208 charges the integration capacitor 224 from the voltage value 860e to the higher voltage value 860f. Thus less time is required to go from the voltage value 860e to the higher voltage value 860f. This is both a savings in time and power using the teachings of the disclosure and as shown in FIG. 8.

Once the third desired voltage value 860f is reached, this voltage value 860f is sampled by and transferred to a second one of the plurality of sample and hold circuits 204 during time T8. The second one of the plurality of sample and hold circuits 204 then retains the desired voltage value, e.g., voltage value 872*b* is substantially the same as the voltage value 860*f*. Also during time T9 the voltage value 860*g* may be discharged from the integration capacitor 224 by the discharge switch 226.

Thus three different voltage values 870, 872 and 874 are sequentially time generated in the order of ascending voltage values, and are available at the respective outputs of the plurality of sample and hold circuits 204. By generating the desired output voltages in time sequential ascending order of voltage values, the integration capacitor 224 does not have to be fully discharged when generating each of the voltage values. Rather, when generating a next higher voltage value, the integration capacitor 224 may be further charged by the IDAC 208 without first having to be fully discharged. This saves the time (one clock) that that would have been required to fully discharge the integration capacitor 224 after reaching each desired voltage value, and then the time required (at least one clock) to charge the integration capacitor 224 from zero charge back to the initial lower voltage value before charging the integration capacitor 224 to the next higher voltage value.

It is contemplated and within the scope of this disclosure that any number of sample and hold circuits 204 may be utilized according to the teachings of this disclosure for producing any number of desired precision analog output voltage values.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for generating a high resolution analog voltage having a plurality of different voltage values, said method comprising the steps of:
   a) generating a constant current having at least one current value;
   b) charging an integration capacitor to a voltage with the constant current over a plurality of time periods, wherein the at least one current value comprises a maximum current value over all except one of the plurality of time periods and less than a maximum current value over the one of the plurality of time periods;
   c) sampling the voltage on the integration capacitor at the end of the plurality of time periods;
   d) storing the sampled voltage;
   e) providing the stored sampled voltage as a high resolution analog voltage;
   f) removing the voltage on the integration capacitor; and
   g) returning to steps a) to f) using a next at least one current value and a next one of the plurality of time periods for the step of charging the integration capacitor.

2. A method for generating a plurality of high resolution analog voltages, said method comprising the steps of:
   a) generating a constant current having at least one current value:
   b) charging an integration capacitor to a voltage with the constant current over a plurality of time periods. wherein the at least one current value comprises a maximum current value over all except one of the plurality of time periods and less than a maximum current value over the one of the plurality of time periods;
   c) sampling and storing the voltage on the integation capacitor at the end of the plurality of time periods in a respective one of a plurality of sample and hold circuits;
   d) removing the voltage on the integration capacitor:
   e) providing the sampled and stored voltage from the respective one of the plurality of sample and hold circuits as a respective one of a plurality of high resolution analog voltages; and
   f) returning to steps a) to e) using a next at least one current value and a next one of the plurality of time periods for the step of charging the integration capacitor.

3. A method for generating a plurality of high resolution analog voltages, said method comprising the steps of:
   a) presorting voltage values of a plurality of high resolution analog voltages in ascending voltage value order;
   b) determining voltage differences between each of the ascending order voltage values;
   c) determining voltage configuration information for generating a first voltage value of the plurality of high resolution analog voltages and voltage increases required for generating subsequent voltage values of the plurality of high resolution analog voltages;
   d) generating a constant current having at least one current value determined from the voltage configuration information;
   e) charging an integration capacitor to a voltage with the constant current over at least one time period determined from the voltage configuration information;
   f) sampling and storing the voltage on the integration capacitor at the end of the at least one time period in a respective one of a plurality of sample and hold circuits;
   g) providing the sampled and stored voltage from the respective one of the plurality of sample and hold circuits as a respective one of the plurality of high resolution analog voltages; and
   h) returning to steps d) to g) using a next at least one current value and a next at least one time period for the step of charging the integration capacitor.

4. The method according to claim 3, wherein the at least one current value comprises a maximum current value over the at least one time period.

5. The method according to claim 3, wherein the at least one current value comprises less than a maximum current value over one time period.

6. The method according to claim 3, wherein the at least one time period is a plurality of time periods and the at least one current value comprises a maximum current value over all except one of the plurality of time periods and less than a maximum current value over the one of the plurality of time periods.

* * * * *